United States Patent
Liu et al.

(10) Patent No.: US 9,543,338 B2
(45) Date of Patent: Jan. 10, 2017

(54) ARRAY SUBSTRATE, METHOD FOR MANUFACTURING THE SAME, AND DISPLAY DEVICE

(71) Applicant: BOE Technology Group Co., Ltd., Beijing (CN)

(72) Inventors: Xiang Liu, Beijing (CN); Gang Wang, Beijing (CN); Jianshe Xue, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 463 days.

(21) Appl. No.: 14/241,345

(22) PCT Filed: Nov. 8, 2013

(86) PCT No.: PCT/CN2013/086741
§ 371 (c)(1),
(2) Date: Feb. 26, 2014

(87) PCT Pub. No.: WO2014/194605
PCT Pub. Date: Dec. 11, 2014

(65) Prior Publication Data
US 2016/0254296 A1    Sep. 1, 2016

(30) Foreign Application Priority Data

Jun. 5, 2013 (CN) .......................... 2013 1 0222271

(51) Int. Cl.
*H01L 21/84* (2006.01)
*H01L 27/12* (2006.01)
(Continued)

(52) U.S. Cl.
CPC ....... *H01L 27/1288* (2013.01); *G02F 1/13439* (2013.01); *G02F 1/136286* (2013.01);
(Continued)

(58) Field of Classification Search
None
See application file for complete search history.

(56) References Cited

U.S. PATENT DOCUMENTS

2003/0178656 A1    9/2003 Kwon et al.
2004/0041958 A1    3/2004 Hwang et al.
(Continued)

FOREIGN PATENT DOCUMENTS

CN    1404626 A    3/2003
CN    1466006 A    1/2004
(Continued)

OTHER PUBLICATIONS

First Office Action and Search Report issued by Chinese Patent Office for priority Chinese application 201310222271.7 dated Sep. 17, 2014 with English translation.
(Continued)

*Primary Examiner* — Angel Roman
(74) *Attorney, Agent, or Firm* — Frommer Lawrence & Haug LLP (57) ABSTRACT

The present invention provides a method for manufacturing an array substrate comprising: sequentially forming an adhesion enhancement layer, a copper-bearing metal layer and a photoresist layer on a substrate, and respectively forming a reserved region and a removal region by performing exposure and development on the photoresist layer using a mask plate, simultaneously processing the adhesion enhancement layer, the copper-bearing metal layer and the photoresist layer in the removal region by a single wet etching process, to form an adhesion enhancement intermediate layer corresponding to the adhesion enhancement layer, a copper-bearing metal intermediate layer corresponding to the copper-bearing metal layer and the photoresist layer thereon in the reserved region; simultaneously processing the adhesion enhancement intermediate layer, the copper-bearing metal intermediate layer and the photoresist layer by a dry etching process, then stripping off the photoresist layer, to form a
(Continued)

patterned adhesion enhancement layer and a patterned copper-bearing metal layer respectively.

17 Claims, 3 Drawing Sheets

(51) Int. Cl.
    *H01L 29/423*     (2006.01)
    *H01L 29/49*     (2006.01)
    *H01L 29/66*     (2006.01)
    *G02F 1/1343*     (2006.01)
    *G02F 1/1362*     (2006.01)
    *H01L 21/027*     (2006.01)
    *H01L 21/4763*     (2006.01)
    *H01L 29/45*     (2006.01)
    *H01L 29/786*     (2006.01)

(52) U.S. Cl.
    CPC .... *H01L 21/0274* (2013.01); *H01L 21/47635* (2013.01); *H01L 27/124* (2013.01); *H01L 27/1225* (2013.01); *H01L 29/42356* (2013.01); *H01L 29/42384* (2013.01); *H01L 29/45* (2013.01); *H01L 29/495* (2013.01); *H01L 29/4908* (2013.01); *H01L 29/66765* (2013.01); *H01L 29/7869* (2013.01); *G02F 2001/136295* (2013.01)

(56) References Cited

U.S. PATENT DOCUMENTS

| | | | |
|---|---|---|---|
| 2005/0181610 A1 | 8/2005 | Sasagawa et al. | |
| 2007/0013077 A1* | 1/2007 | Lee | H01L 23/53238 257/762 |
| 2007/0284336 A1 | 12/2007 | Hamada et al. | |
| 2008/0138942 A1 | 6/2008 | Lee et al. | |
| 2009/0233388 A1* | 9/2009 | Kwon | H01L 29/458 438/22 |
| 2010/0051934 A1 | 3/2010 | Choung et al. | |
| 2011/0068402 A1* | 3/2011 | Takasawa | C23C 14/0057 257/347 |
| 2011/0133193 A1* | 6/2011 | Song | H01L 27/12 257/59 |
| 2014/0014952 A1* | 1/2014 | Katsui | H01L 29/41733 257/43 |

FOREIGN PATENT DOCUMENTS

| | | |
|---|---|---|
| CN | 101192527 A | 6/2008 |
| CN | 101424836 A | 5/2009 |
| CN | 101425476 A | 5/2009 |
| CN | 101971350 A | 2/2011 |
| CN | 103295970 A | 9/2013 |
| JP | 07-211697 A | 8/1995 |
| JP | 2000-252283 A | 9/2000 |

OTHER PUBLICATIONS

Second Office Action and Search Report issued by Chinese Patent Office for priority Chinese application 201310222271.7 dated Jan. 12, 2015 with English translation.

International Search Report and Written Opinion issued by Chinese Patent Office, acting as the International Searching Authority, for International Application PCT/CN2013/086741 mailed Mar. 20, 2014 with English translation of Written Opinion.

* cited by examiner sequentially forming adhesion enhancement layer, copper-bearing metal layer and photoresist layer on substrate, and respectively forming reserved region and removal region by performing exposure and development on photoresist layer using mask plate, wherein reserved region corresponds to pattern forming region, simultaneously processing adhesion enhancement layer, copper-bearing metal layer and photoresist layer in removal region by single wet etching process, to form adhesion enhancement intermediate layer corresponding to adhesion enhancement layer, copper-bearing metal intermediate layer corresponding to copper-bearing metal layer and photoresist layer — 11

↓ simultaneously processing adhesion enhancement intermediate layer, copper-bearing metal intermediate layer and photoresist layer thereon by dry etching process, then stripping off photoresist layer, to form patterned adhesion enhancement layer and patterned copper-bearing metal layer respectively — 12

ARRAY SUBSTRATE, METHOD FOR MANUFACTURING THE SAME, AND DISPLAY DEVICE

This application is a 371 of PCT/CN2013/086741 filed on Nov. 8, 2013, which claims priority benefits from Chinese Patent Application Number 201310222271.7 filed Jun. 5, 2013, the disclosure of which is incorporated herein by reference.

TECHNICAL FIELD

The present invention relates to the field of display technology, and particularly, to an array substrate, a method for manufacturing the same, and a display device.

BACKGROUND ART

Liquid crystal display made of thin film transistors has characteristics such as small size, low power consumption, no radiation, and so on, thus dominates the current flat panel display market. Liquid crystal panel is an important component of the liquid crystal display, and comprises an array substrate, a color filter substrate, and a liquid crystal layer filled between the array substrate and the color filter substrate.

The array substrate comprises a plurality of thin film transistors arranged in an array, which are formed on a glass or plastic substrate by sputtering chemical vapor deposition and other processes. The gate electrodes of the thin film transistors in the same row are connected together by a gate line, and the source electrodes of the thin film transistors in the same column are connected together by a data line, wherein the materials of the gate line and the data line are typically tantalum, chromium, molybdenum, or an alloy of at least two of them.

With the gradually increasing size of the liquid crystal display, the lengths of the gate line and the data line in the array substrate also increase, resulting in increasing resistance of the gate line and the data line. Since the signal delay time of a signal line is proportional to the resistance of the signal line, an increase in the resistance of a signal line will result in an increase in the signal delay time of the signal line. When the signal delay time reaches to a certain extent, some pixels are not fully charged, resulting in uneven brightness and lower contrast of the liquid crystal display, thereby the quality of the image displayed on the liquid crystal display is seriously affected.

SUMMARY

The present invention provides an array substrate, a method for manufacturing the same, and a display device, which solve the problem that the large resistance of the long gate line and the long date line in a large-size liquid crystal display will lead to a decline in the image display quality of the liquid crystal display.

To achieve the above object, the present invention employs the following technical solutions.

The present invention provides a method for manufacturing an array substrate, comprising:

(1) sequentially forming a first adhesion enhancement layer, a first copper-bearing metal layer and a photoresist layer on a substrate, and respectively forming a reserved region and a removal region by performing exposure and development on the photoresist layer using a mask plate, wherein the reserved region corresponds to a pattern forming region; simultaneously processing the first adhesion enhancement layer, the first copper-bearing metal layer and the photoresist layer in the removal region by a single wet etching process, to form a first adhesion enhancement intermediate layer corresponding to the first adhesion enhancement layer, a first copper-bearing metal intermediate layer corresponding to the first copper-bearing metal layer and the photoresist layer thereon in the reserved region; and simultaneously processing the first adhesion enhancement intermediate layer, the first copper-bearing metal intermediate layer and the photoresist layer thereon by a dry etching process, then stripping off the photoresist layer, to form a patterned first adhesion enhancement layer and a patterned first copper-bearing metal layer respectively, wherein the first adhesion enhancement layer is a metal layer for enhancing adhesion of the first copper-bearing metal layer to the substrate.

The patterned first copper-bearing metal layer may be a pattern comprising gate electrodes.

The pattern comprising gate electrodes comprises gate electrodes and a gate lines formed in the same layer.

The patterned first copper-bearing meal layer may be a pattern comprising source electrodes and drain electrodes.

The pattern comprising source electrodes and drain electrodes comprises source electrodes, drain electrodes and data lines formed in the same layer.

The material of the first copper-bearing metal layer is copper or copper alloy.

The material of the first adhesion enhancement layer is any one of tungsten, tantalum, titanium, molybdenum, molybdenum alloy and titanium alloy.

The thickness of the first adhesion enhancement layer is 100~1000 Å, and the thickness of the first capper-bearing metal layer is 1500~5000 Å.

After the single wet etching process, the width of the formed first adhesion enhancement intermediate layer is larger than the width of the formed first copper-bearing metal intermediate layer, so that the first adhesion enhancement intermediate layer forms a step structure with respect to the first copper-bearing metal intermediate layer, and the step structure will be removed by a subsequent dry etching process.

The above method for manufacturing an array substrate further comprises: (2) sequentially forming a gate insulation material layer and a semiconductor material layer on the substrate subjected to step (1), and processing the semiconductor material layer by a patterning process to form a pattern comprising an active layer, wherein the gate insulation material layer is used for forming a gate insulation layer; and (3) sequentially forming a second adhesion enhancement layer, a second copper-bearing metal layer and a photoresist layer on the substrate subjected to step (2), and respectively forming a reserved region and a removal region by performing exposure and development on the photoresist layer using a mask plate, wherein the reserved region corresponds to a pattern forming region; simultaneously processing the second adhesion enhancement layer, the second copper-bearing metal layer and the photoresist layer in the removal region by a wet etching process, to form a second adhesion enhancement intermediate layer corresponding to the second adhesion enhancement layer, a second copper-bearing metal intermediate layer corresponding to the second copper-bearing metal layer and the photoresist layer thereon in the reserved region; and simultaneously processing the second adhesion enhancement intermediate layer, the second copper-bearing metal intermediate layer and the photoresist layer thereon by a dry etching process, then stripping off the photoresist layer, to form a patterned second adhesion enhancement layer and a patterned second copper-bearing metal layer respectively, wherein the second adhesion enhancement layer is a metal layer for enhancing adhesion of the second copper-bearing metal layer to the active layer.

The patterned second copper-bearing metal layer is a pattern comprising source electrodes and drain electrodes.

The pattern comprising source electrodes and drain electrodes comprises source electrodes, drain electrodes and data lines formed in the same layer.

The material of the second copper-bearing metal layer is copper or copper alloy.

The material of the second adhesion enhancement layer is any one of tungsten, tantalum, titanium, molybdenum, molybdenum alloy and titanium alloy.

The thickness of the second adhesion enhancement layer is 100~1000 Å, and the thickness of the second copper-bearing metal layer is 1500~5000 Å.

After the single wet etching process, the width of the famed second adhesion enhancement intermediate layer is larger than the width of the formed second copper-bearing metal intermediate layer, so that the second adhesion enhancement intermediate layer forms a step structure with respect to the second copper-bearing metal intermediate layer, and the step structure will be removed by a subsequent dry etching process.

The gate insulation material layer is a mono-layer, double-layer or multi-layer structure composed of oxide, nitride or nitrogen oxide.

The above method for manufacturing an array substrate further comprises steps: (4) forming a passivation layer on the substrate subjected to step (3), and forming a passivation layer pattern comprising via-holes by a patterning process; and (5) forming a transparent conductive layer on the substrate subjected to step (4), and forming a pattern comprising pixel electrodes by a patterning process, wherein the pixel electrodes are connected with the drain electrodes through the via-holes.

The present invention also provides an array substrate which is manufactured by the method for manufacturing an array substrate according to the present invention.

The present invention also provides a display device comprising the above array substrate.

In the array substrate, the method for manufacturing the same and the display device according to the present invention, the gate lines and the data lines are formed by using the copper-bearing metal layer. Since the resistance of copper is small, the problem that the large resistance of the gate lines and the date lines in a large-size liquid crystal display will result in increases of the signal delay times of the gate lines and the data lines can be avoided, thereby the quality of the Image displayed on the display device can be improved. In addition, the adhesion enhancement layer is used for enhancing adhesion of the copper-bearing metal layer to the substrate, thus reliability of the array substrate is improved.

In the method for manufacturing the array substrate according to the present invention, the pattern layer comprising gate electrodes and/or the pattern layer comprising source electrodes and drain electrodes are formed by a single wet etching process and a dry etching process, this is because, in the present invention, a combination of an adhesion enhancement layer and a copper-bearing metal layer is used instead of a single metal layer in the prior art to form the pattern layer comprising gate electrodes and the pattern layer comprising source electrodes and drain electrodes, and when the adhesion enhancement layer and the copper-bearing metal layer are etched by using the single wet etching process, due to difference in the etching velocity between the adhesion enhancement layer and the copper-bearing metal layer, the width of the adhesion enhancement layer will be larger than the width of the copper-bearing metal layer after the single wet etching process, thereby a step structure is formed, it is harmful for the subsequent manufacturing processes of the array substrate and reliability of the array substrate, therefore, in the present invention, a dry etching process is added after the single wet etching process to remove the step structure. Such an etching procedure, in which a wet etching process is first performed and a dry etching process is then performed, effectively solves the problem that there is residual adhesion enhancement layer after the wet etching process, thus a good cross-section of the patterned copper-bearing metal layer is formed, and the issue relating to the thin film covering due to the poor cross-section of the patterned copper-bearing metal layer is solved, thereby its impact on the gate line and the data line is avoided, and reliability of the resultant array substrate can be ensured.

BRIEF DESCRIPTION OF THE DRAWINGS

In order to more clearly illustrate the technical solutions according to the embodiments of the present invention, the drawings used in the descriptions of the embodiments will be briefly introduced.

DETAILED DESCRIPTION OF THE PREFERRED EMBODIMENTS

Technical solutions according to the embodiments of the present invention will be described below clearly and completely with reference to the drawings.

Figure 1:
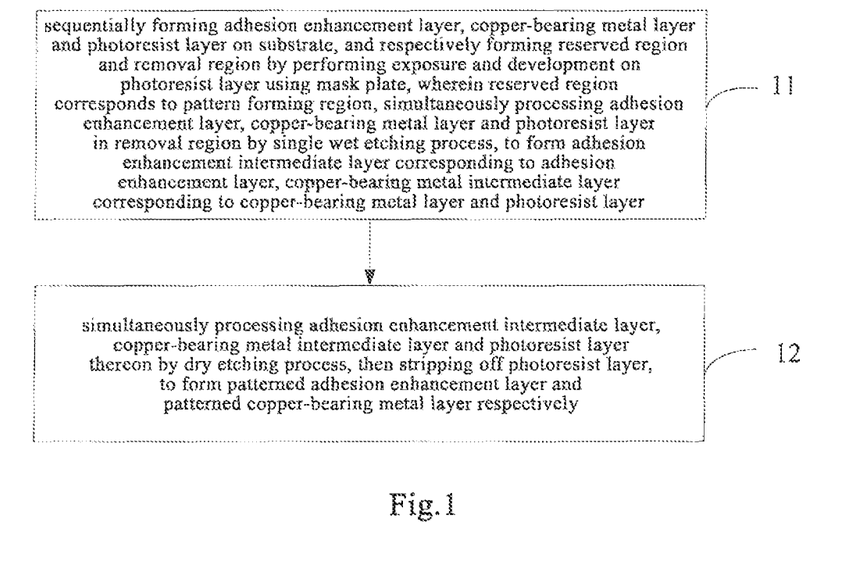
FIG. 1 is a flowchart showing the method for manufacturing an array substrate according to an embodiment of the present invention.

An embodiment of the present invention provides a method for manufacturing an array substrate, as shown in FIG. 1, comprising:

Step 11. Sequentially forming an adhesion enhancement layer, a copper-bearing metal layer and a photoresist layer on a substrate, and respectively forming a reserved region and a removal region by performing exposure and development on the photoresist layer using a mask plate, wherein the reserved region corresponds to a pattern forming region; simultaneously processing the adhesion enhancement layer, the copper-bearing metal layer and the photoresist layer in the removal region by a single wet etching process, to form an adhesion enhancement intermediate layer corresponding to the adhesion enhancement layer, a copper-bearing metal intermediate layer corresponding to the copper-bearing metal layer and the photoresist layer on copper-bearing metal intermediate layer.

Wherein, the adhesion enhancement layer and the copper-bearing metal layer can be formed by depositing, coating, sputtering, thermal evaporating, or other methods. The method for forming the adhesion enhancement layer and the copper-bearing metal layer can be determined according to materials of the adhesion enhancement layer and the copper-bearing metal layer. For example, the photoresist layer can be formed by coating, and the present invention is not limited thereto.

Step 12. Simultaneously processing the adhesion enhancement intermediate layer, the copper-bearing metal intermediate layer and the photoresist layer thereon by a dry etching process, then stripping off the photoresist layer, to form a patterned adhesion enhancement layer and a patterned copper-bearing metal layer respectively.

In the method for manufacturing an array substrate according to the embodiment of the present invention, an adhesion enhancement layer, a copper-bearing metal layer and a photoresist layer are sequentially formed on a substrate, then a reserved region and a removal region are respectively formed by exposure and development using a mask plate, wherein the reserved region corresponds to the pattern forming region, then the adhesion enhancement layer, the copper-bearing metal layer and the photoresist layer in the removal region are simultaneously processed by a single wet etching process, then a dry etching process is followed and the photoresist layer is stripped off, thereby a patterned adhesion enhancement layer and a patterned copper-bearing metal layer are formed, wherein the adhesion enhancement layer can enhance the adhesion between the copper-bearing metal layer and the substrate, and at least one of the gate electrode, the gate line, the source electrode, the drain electrode, and the data line can be formed by the copper-bearing metal layer. Since the resistance of copper is relatively low, thereby the issue due to the signal delay of the gate line and the data line in a large-size display device can be avoided, and the quality of the image displayed on the display device can be improved. Moreover, in the method for manufacturing an array substrate according to the embodiment of the present invention, de etching procedure comprising a first wet etching process and a second dry etching process employed as a patterning process to form the patterned copper-bearing metal layer and the patterned adhesion enhancement layer, the problem that there is residual adhesion enhancement layer after the wet etching process can be effectively solved, thus a good cross-section of the patterned copper-bearing metal layer is formed, and the issue in the thin film covering due to the poor cross-section of the patterned copper-bearing metal layer is solved.

It should be noted that, the above patterning process may be a MASK patterning process which usually uses four, five or more MASKs. The general procedure of a MASK patterning process comprises: first depositing a corresponding thin film layer or metal layer on an array substrate, then applying a photoresist layer on the top layer, and patterning the photoresist layer by performing exposure and development on the photoresist layer using a certain mask plate, then forming a certain pattern on the array substrate by an etching process, finally removing the photoresist layer by a stripping process, and the corresponding pattern is completed. In a MASK patterning process using one MASK, more than one stripping processes of the photoresist layer may be required. Of course, other patterning processes may be used for manufacturing an array substrate.

In the present invention, the patterning process may comprise a photolithographic process, or comprise a photolithographic process and an etching step, or comprise printing, ink-jetting, and other processes for forming a predetermined pattern, wherein the photolithographic process is a process comprising film forming, exposure, development and so on, which is used for forming a pattern by using photoresist, mask plate, exposure machine, etc. The patterning process can be determined according to the structure to be formed in the present invention.

The patterned copper-bearing metal layer is a pattern comprising gate electrodes and/or a pattern comprising source electrodes and drain electrodes. That is, in the method, only a pattern comprising gate electrodes may be formed, or only a pattern comprising source electrodes and drain electrodes may be formed, preferably both a pattern comprising gate electrodes and a pattern comprising source electrodes and drain electrodes are formed. When only a pattern comprising gate electrodes is formed in the method, the source electrodes and the drain electrodes can be formed by other methods. As an example, in the method according to the embodiment of the present invention, both the pattern comprising source electrodes and drain electrodes and the pattern comprising gate electrodes are formed.

In addition, in the method for manufacturing an array substrate gate lines can be formed simultaneously in the same layer as the gate electrodes when the gate electrodes are formed, and data lines can be formed simultaneously in the same layer as the source electrodes and the drain electrodes when the source electrodes and the drain electrodes are formed, and the present invention is not limited thereto. For example, the gate lines may be formed in a different layer from the gate electrodes, and the data lines may be formed in a different layer from the source electrodes and the drain electrodes.

The specific steps in the method for manufacturing an array substrate comprise:

step (1) Sequentially forming a first adhesion enhancement layer, a first copper-bearing metal layer on a substrate, then applying a photoresist layer, and respectively forming a complete reserved region and a complete removal region by performing exposure and development on the photoresist layer using a mask plate, wherein the complete reserved region corresponds to the pattern forming region; simultaneously processing the first adhesion enhancement layer, the first copper-bearing metal layer and the photoresist layer in the complete removal region by a single wet etching process, to form a first intermediate layer corresponding to the first adhesion enhancement layer, a second intermediate layer corresponding to the first copper-bearing metal layer and the photoresist layer thereon; and simultaneously processing the first intermediate layer, the second intermediate layer and the photoresist layer by a dry etching process, then stripping off the photoresist layer, to form a pattern layer comprising the first adhesion enhancement layer and a pattern layer comprising gate electrodes respectively;

step (2) Sequentially depositing a gate insulation material layer and a semiconductor material layer on the substrate subjected to step (1), and processing the semiconductor material layer by a patterning process to form a pattern comprising an active layer wherein the gate insulation material layer is used for forming a gate insulation layer;

step (3) Sequentially depositing a second adhesion enhancement layer, a second copper-bearing metal layer on the substrate subjected to step (2), then applying a photoresist layer, and respectively forming a reserved region and a removal region by performing exposure and development on the photoresist layer using a mask plate, wherein the reserved region corresponds to the pattern forming region; simultaneously processing the second adhesion enhancement layer, the second copper-bearing metal layer and the photoresist layer in the removal region by a single wet etching process, to form a third intermediate layer corresponding to the second adhesion enhancement layer, a fourth intermediate layer corresponding to the second copper-bearing metal layer and the photoresist layer thereon and simultaneously processing the third intermediate layer, the fourth intermediate layer and the photoresist layer thereon by a dry etching process, then stripping off the photoresist layer, to respectively form a pattern layer comprising the second adhesion enhancement layer and a pattern layer comprising source electrodes and drain electrodes.

The material of the copper-bearing metal layers may be copper or copper alloy. The material of the adhesion enhancement layers may be any one of tungsten, tantalum, titanium, molybdenum, molybdenum alloy and titanium alloy, etc. In the embodiment of the present invention, as an example, the material of the copper-bearing metal layers is copper or copper alloy, and the material of the adhesion enhancement layers is any one of tungsten, tantalum, titanium, molybdenum, molybdenum alloy and titanium alloy. Of course, when the material of the copper-bearing metal layers is copper or copper alloy, the material of the adhesion enhancement layers may be other material other than tungsten, tantalum, titanium, molybdenum, molybdenum alloy and titanium alloy. The step structure formed in the embodiment of the present invention is not limited thereto, and a corresponding structure may be formed in accordance with properties of the specific material.

The thickness of each of the adhesion enhancement layers may be 100~1000 Å, and the thickness of each of the copper-bearing metal layers may be 1500~5000 Å. Preferably, the thickness of each of the adhesion enhancement layers is 100~800 Å, and the thickness of each of the copper-bearing metal layers is 2000~5000 Å. More preferably, the thickness of each of the adhesion enhancement layers is 200~500 Å.

Figure 3:
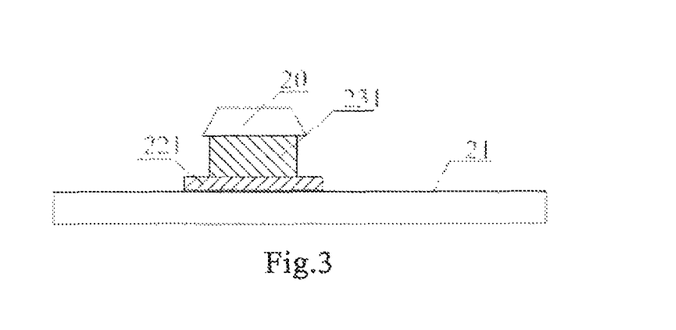
Figure 4A:
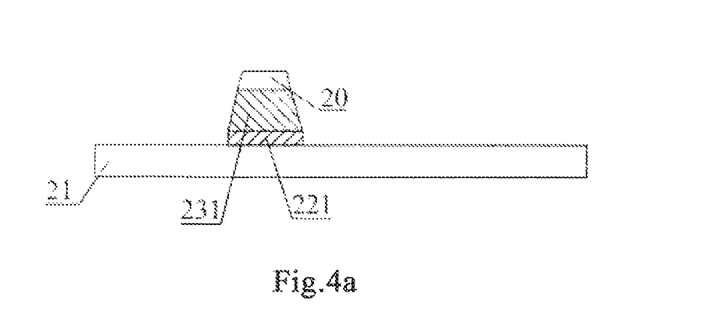
Figure 4B:
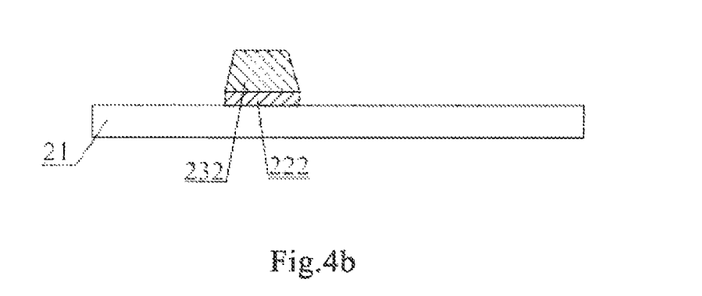

The above method for manufacturing an array substrate will be described below in detail with reference to FIG. 2 to FIG. 8, wherein FIG. 4 and FIG. 4b are collectively referred to as FIG. 4.

Figure 2:
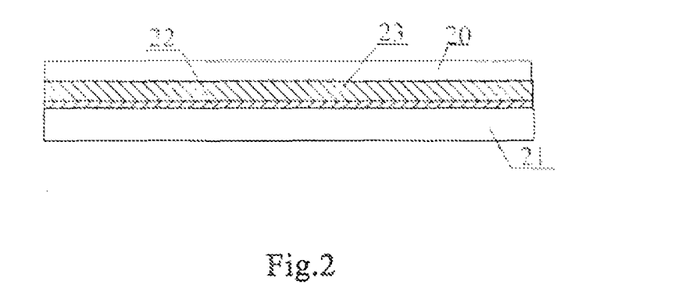
FIG. 2-FIG. 8 are schematic diagrams of the cross-sections of the structures corresponding to the manufacturing processes in the method for manufacturing an array substrate according to an embodiment of the present invention.

As to step (1), as shown in FIG. 2, the first adhesion enhancement layer 22 and the first copper-bearing metal layer 23 are sequentially deposited on the substrate 21, then a photoresist layer 20 is applied on the first copper-bearing metal layer 23, wherein the thickness of the first adhesion enhancement layer 22 may be 100~1000 Å, preferably is 100~800 Å, and more preferably is 200~500 Å, and the material of the first adhesion enhancement layer 22 may be the metal such as tungsten, tantalum, titanium, molybdenum, molybdenum alloy or titanium alloy. The material of the first copper-bearing metal 23 may be the metal only containing copper or copper alloy, and the thickness of the first copper-bearing metal 23 may be 1500~5000 Å, preferably is 2000~5000 Å. Compared to the metal such as chromium, molybdenum, the resistance of copper or copper alloy is relatively low, which can reduce the signal delay time. The thickness of the photoresist layer 20 applied on the first copper-bearing metal layer 23 may be 20000~50000 Å. However, the thickness of the photoresist layer 20 may be determined according to the structure of the mask plate, the degree of exposure and the etching process.

Then, a complete reserved region and a complete removal region are respectively formed by performing exposure and development on the photoresist layer 20 using a common mask plate, wherein the complete reserved region corresponds to the pattern forming region. The photoresist layer 20 on the region corresponding to the pattern forming region is completely reserved, thereby a complete reserved region is formed. The photoresist layer 20 on other regions is completely removed after development, thereby a complete removal region is famed. Then, the first adhesion enhancement 22 and the first copper-baring metal layer 23 in the complete removal region are etched off by a single wet etching process so that the first intermediate layer 221 corresponding to the first adhesion enhancement layer 22, the second intermediate layer 231 corresponding to the first copper-bearing metal layer 23 and the photoresist layer 20 on the second intermediate layer 231 are formed in the complete reserved region, as shown in FIG. 3. It can be seen from FIG. 3, the width of the first intermediate layer is larger than the width of the second intermediate layer, and a step structure is formed by the second intermediate layer with respect to the first intermediate layer and the substrate.

This is because the metal materials contained in the first copper-bearing metal layer 23 and the first adhesion enhancement layer 22 are different from each other, thus the etching velocities of them are different from each other, wherein the etching velocity of the first copper-bearing metal layer 23 is faster. Therefore, after the wet etching process, a step structure as shown in FIG. 3 is formed in the region covered by the photoresist layer 20 (i.e., the complete reserved region). In FIG. 3, the widths of the formed first intermediate layer 221 and the formed second intermediate layer 231 are different from each other (the width of the first intermediate layer 221 is larger), thus a step structure is formed by the second intermediate layer 231 with respect to the first intermediate layer 221 and the substrate 21. Taking into account the need to form the source electrode, the drain electrode, the pixel electrode and so on in the subsequent steps, in the structure shown in FIG. 3, it is easy to find that the step structure will seriously affect the coverage of the thin film needed to be deposited subsequently.

In view of the above defect, as shown in FIG. 4a and FIG. 4b, the first intermediate layer 221, the second intermediate layer 231 and the photoresist layer 20 on the second intermediate layer 231 are simultaneously processed by a dry etching process, and a part of the photoresist layer and the step structure are removed, then the photoresist layer is stripped off and a patterned first adhesion enhancement layer 222 and a patterned first copper-bearing metal layer 232 are formed respectively, wherein the patterned first adhesion enhancement layer 222 is used for forming a pattern layer comprising the first adhesion enhancement layer, and the patterned first copper-bearing metal layer 232 is used for forming a pattern layer comprising a gate electrode. The patter layer comprising a gate electrode may comprise a gate electrode and a gate line formed in the same layer.

Since the step structure left by the second intermediate layer 231 after a single wet etching process will seriously affect the manufacture of the array substrate, it will be removed by a dry etching process. As the dry etching process will corrupt the photoresist layer 20 to some extent, a structure as shown in FIG. 4a will be formed after the dry etching process. In FIG. 4a, the step structure of the second intermediate layer 231 is removed, and the widths of the first intermediate layer 221, the second intermediate layer 231 and the photoresist layer 20 are reduced, thereby the appearances of the patterned first copper-bearing metal layer 232 and the patterned first adhesion enhancement layer 222 after stripping off the photoresist layer 20 can be ensured by controlling the dry etching process. Specially, for an example of reactive plasma dry etching equipment, the general parameters of the dry etching process comprise: radio frequency power of 3 kilowatts~12 kilowatts, air pressure of 100 mT (mTorr)~1000 mT (mTorr), and gas flow of 1000~4000 cm$^3$/min under standard conditions. After the dry etching process, the photoresist layer 20 shown in FIG. 4a is stripped off by ashing or other processes. The patterned first adhesion enhancement layer 222 enables the pattern layer comprising a gate electrode steadily fixed on the substrate 21, as shown in FIG. 4b, wherein a gate line may be formed when the gate electrode is formed.

It should be noted that, the etching purpose of the wet etching process is achieved by corrosion of chemical liquid, and the etching purpose of the dry etching process is achieved by first causing gas to become plasmas through an electric field and then reacting the plasmas with the corresponding thin film or metal layer. Therefore, it should be known that, the dry etching process is an etching process suitable for a relative small range, that is, refining, thus the etching process comprising first a wet etching process and then a dry etching process is employed in the embodiment of the present invention.

Figure 5:
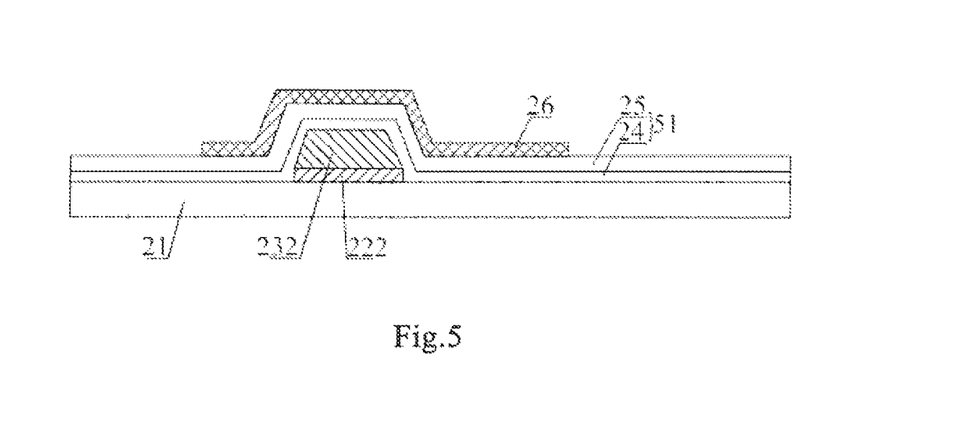

As to step (2), as shown in FIG. 5, a gate insulation material layer and a semiconductor material layer are sequentially deposited on the substrate subjected to step (1), then a pattern comprising an active layer 26 is formed by processing the semiconductor material layer through a patterning process, wherein the gate insulation material layer is used for forming a gate insulation layer 51.

Specially, the gate insulation layer 51 may be of a single-layer or double-layer structure. Of course, the gate insulation layer SI also may be of a multilayer structure so that a better insulation effect can be achieved, and the diffusion of copper ions (the metal layer contains copper) can be prevented better. When the gate insulation layer 51 is of a double-layer structure, the material layer adjacent to the patterned first copper-bearing metal layer 232 may be a nitride layer 24, and the material layer away from the patterned first copper-bearing metal layer 232 may be an oxide layer 25. When the gate insulation layer 51 is of a multilayer structure, for example, a three-layer structure, a nitride layer, an oxynitride layer and an oxide layer may be formed sequentially in the ascending order of distance from the patterned first copper-bearing metal layer.

Specially, the materials of the nitride layer 24 and the oxide layer 25 may be silicon nitride and silicon oxide respectively, and the material of the oxynitride layer may be silicon oxynitride. The reactive gas corresponding to the gate insulation layer 51 with a double-layer structure may be silane, ammonia, or nitrogen, and the reactive gas corresponding to the gate insulation layer 51 with a three-layer structure may be dichlorosilane, ammonia, or nitrogen.

In FIG. 5, the semiconductor material layer is preferably a metal oxide semiconductor layer, and the reactive gas used for processing the semiconductor material layer may be silane, ammonia, dichlorosilane or ammonia. After performing exposure and development on the photoresist layer (not shown in FIG. 5) applied on the semiconductor material layer, the photoresist layer in the region formed with an active layer 26 is reserved, and the photoresist layer in other regions is removed, then the semiconductor material layer in the other regions is etched by a single wet etching process or other etching processes, and the photoresist layer on the semiconductor material layer is stripped off by ashing or other processes, thereby a pattern comprising an active layer 26 is formed, as shown in FIG. 5.

As to step (3), a second adhesion enhancement layer and a second copper-bearing metal layer are sequentially deposited on the substrate 21 subjected to step (2), then a photoresist layer is applied on the second copper-baring metal layer. After performing exposure and development on the photoresist layer using a mask plate, a reserved region and a removal region are formed, wherein the reserved region corresponds to the pattern forming region. Then, the second adhesion enhancement layer, the second copper-bearing metal layer and the photoresist layer in the removal region are simultaneously processed by a single wet etching process, and a third intermediate layer corresponding to the second adhesion enhancement layer, a fourth intermediate layer corresponding to the second copper-bearing metal layer and the photoresist layer on the fourth intermediate layer are formed.

After step (2), a source electrode and a drain electrode are needed to be formed on the active layer 26. Specially, in order to adhere the second copper-bearing metal layer to the active layer 26 more fixedly, the step (1) is repeated for the substrate 21 subjected to step (2), that is, the second adhesion enhancement layer and the second copper-bearing metal layer are sequentially deposited on the substrate and the photoresist layer is applied on the second copper-bearing metal layer. Since the etching velocities of the second adhesion enhancement layer and the second copper-bearing metal layer are different from each other, the widths of the third intermediate layer and the fourth intermediate layer formed by the single wet etching process are not equal to each other, thus there is a step structure formed between the fourth intermediate layer and the third intermediate layer. This procedure is the same as that for forming the pattern comprising gate electrodes in the step (1), and repetitious details thereof will not be given here.

Figure 6:
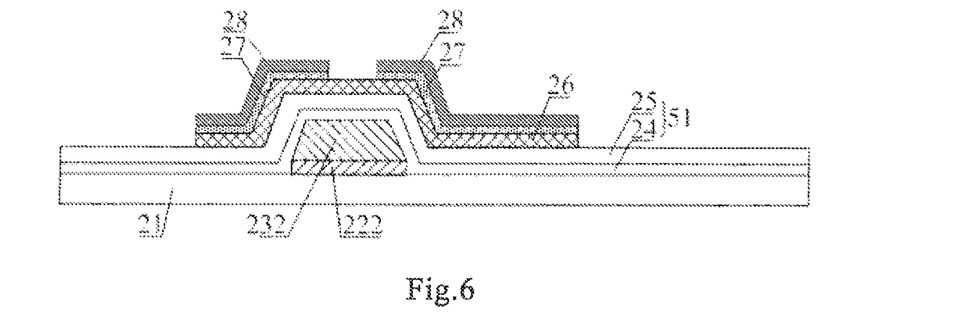

Then, as shown in FIG. 6, the third intermediate layer, the fourth intermediate layer and the photoresist layer thereon are simultaneously processed by a dry etching process, then the photoresist layer is stripped oft and a patterned second adhesion enhancement layer 27 and a patterned second copper-bearing metal layer 28 are formed respectively, wherein the patterned second adhesion enhancement layer 27 is used for forming a pattern layer comprising the second adhesion enhancement 27, and the patterned second copper-bearing metal layer 28 is used for forming a pattern layer comprising a source electrode and a drain electrode. The pattern layer comprising a source electrode and a drain electrode may comprise a source electrode, a drain electrode and a data line formed in the same layer, wherein the data line is formed when the source electrode and the drain electrode are formed.

It should be noted that, in the procedure for manufacturing an array substrate, since a gap should be formed between the source electrode and the drain electrode when the source electrode and the drain electrode are formed, in order to simplify the etching process, a special mask plate (for example, a half exposure mask plate) is typically used. That is, a half reserved region is formed when the complete reserved region and the complete removal region are formed so that the operation is simplified. Of course, a general mask plate may be used and the etching process will be controlled to complete the patterning process (MASK) or change the number of the patterning processes.

Figure 7:
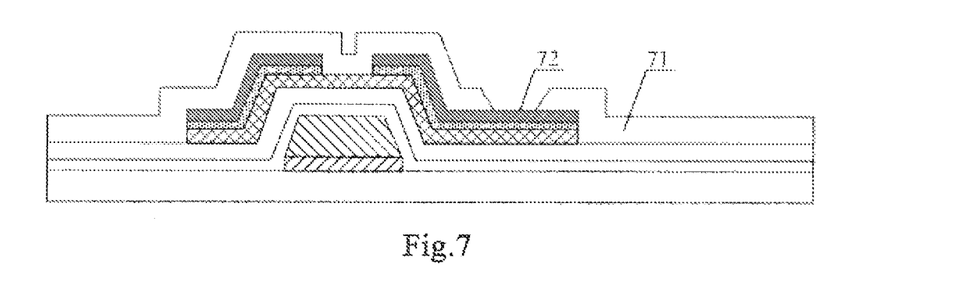

The method for manufacturing an array substrate according to the embodiment of the present invention further comprises a step (4), as shown in FIG. 7, a passivation layer 71 is deposited on the substrate subjected to step (3), the thickness of the passivation layer 71 may be 1000~5000 Å, and the material of the passivation layer 71 may be the same as that of the gate insulation layer 51. Then, a via-hole 72 is formed in the region of the passivation layer 71 corresponding to the drain electrode by etching. The via-hole 72 is used for connecting with a transparent conductive film.

Figure 8:
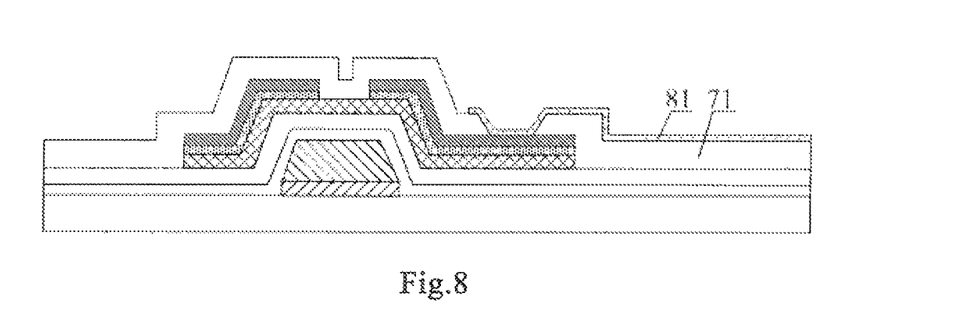

The method for manufacturing an array substrate according to the embodiment of the present invention further comprises a step (5), as shown in FIG. 8, a transparent conductive layer 81 may be formed by sputtering or thermal evaporating process, wherein the thickness of the transparent conductive layer 81 may be 300~1000 Å, and the material of the transparent conductive layer 81 may be tin-doped indium oxide film (ITO), or other oxide or metal. The transparent conductive layer 81 is used for forming a pixel electrode which is connected with the drain electrode via the via-hole 72.

It should be noted that, the same parts in FIG. 6 to FIG. 8 are presented by the same reference numbers.

Another embodiment of the present invention provides an array substrate which is manufactured by the above method for manufacturing an array substrate.

Since the array substrate according to the embodiment of the present invention is manufactured by the above method for manufacturing an array substrate, and in the above method for manufacturing an array substrate, an adhesion enhancement layer, a copper-bearing metal layer and a photoresist layer are sequentially formed on a substrate, then a reserved region and a removal region are respectively formed by performing exposure and development on the photoresist layer using a mask plate, wherein the reserved region corresponds to the pattern forming region, then the adhesion enhancement layer, the copper-baring metal layer and the photoresist layer in the removal region are simultaneously processed by a single wet etching process, then a dry etching process is followed and the photoresist layer is stripped off, to form a patterned adhesion enhancement layer and a patterned copper-bearing metal layer wherein the adhesion enhancement layer can enhance adhesion of the copper-bearing metal layer to the substrate, and at least one of the gate electrode, the gate line, the source electrode, the drain electrode, and the data line can be formed by the copper-bearing metal layer, since the resistance of copper is relatively low thereby the Issue due to the signal delay of the gate line and the data line in a large-size display device can be avoided, and the quality of the image displayed on the display device can be improved. Moreover, in the patterning process for forming the patterned copper-bearing metal layer and the patterned adhesion enhancement layer, the etching procedure in which a wet etching process is first performed and a dry etching process is then performed, is employed, thereby the problem that there is residual adhesion enhancement layer after the wet etching process can be effectively solved, thus a good cross-section of the patterned copper-bearing metal layer is formed, and the issue relating to thin film covering due to the poor cross-section of the patterned copper-bearing metal layer is solved.

Another embodiment of the present invention provides a display device comprising the array substrate according to the above embodiment of the present invention. The display device may be a liquid crystal panel, an electronic paper, an OLED panel, a liquid crystal television, a liquid crystal display, a digital photo frame, a mobile telephone, a tablet personal computer, or any product or component with a display function.

Since the above array substrate is employed in the display device according to the embodiment of the present invention, the issue of signal delay of the gate lines and the data lines in a largo-size display device can be avoided, and the pixels can be fully charged, thereby an uniform brightness is obtained, and the contrast of the display device and the quality of the image displayed on the display device are improved.

It should be understood that, the above implementations are only used to explain the principle of the present invention, but not to limit the present invention, the person skilled in the art can make various variations and modifications without departing from the spirit and scope of the present invention, therefore, all equivalent technical solutions fall within the scope of the present invention, and the protection scope of the present invention should be defined by the claims.

The invention claimed is:

1. A method for manufacturing an array substrate, comprising a step:

(1) sequentially forming a first adhesion enhancement layer, a first copper-bearing metal layer and a photoresist layer on a substrate, and respectively forming a reserved region and a removal region by performing exposure and development on the photoresist layer using a mask plate, wherein the reserved region corresponds to a pattern forming region; simultaneously processing the first adhesion enhancement layer, the first copper-bearing metal layer and the photoresist layer in the removal region by a single wet etching process to completely remove the first adhesion enhancement layer, the first copper-bearing metal layer, and the photoresist layer in the removal region, thus forming a first adhesion enhancement intermediate layer corresponding to the first adhesion enhancement layer, a first copper-bearing metal intermediate layer corresponding to the first copper-bearing metal layer, and the photoresist layer on the first copper-bearing metal intermediate layer in the reserved region, wherein the width of the formed first adhesion enhancement intermediate layer is larger than the width of the formed first copper-bearing metal intermediate layer, so that the first adhesion enhancement intermediate layer forms a step structure with respect to the first copper-bearing metal intermediate layer; and simultaneously processing the first adhesion enhancement intermediate layer, the first copper-bearing metal intermediate layer and the photoresist layer thereon in the reserved region by a dry etching process to remove the step structure, then stripping off the photoresist layer, to form a patterned first adhesion enhancement layer and a patterned first copper-bearing metal layer respectively, wherein the first adhesion enhancement layer is a metal layer for enhancing adhesion of the first copper-bearing metal layer to the substrate.

2. The method of claim 1, wherein the patterned first copper-bearing metal layer is a pattern comprising gate electrodes.

3. The method of claim 2, wherein the pattern comprising gate electrodes comprises gate electrodes and gate lines formed in the same layer.

4. The method of claim 1, wherein the patterned first copper-bearing metal layer is a pattern comprising source electrodes and drain electrodes.

5. The method of claim 4, wherein the pattern comprising source electrodes and drain electrodes comprises source electrodes, drain electrodes and data lines formed in the same layer.

6. The method of claim 1, wherein the material of the first copper-bearing metal layer is copper or copper alloy.

7. The method of claim 1, wherein the material of the first adhesion enhancement layer is any one of tungsten, tantalum, titanium, molybdenum, molybdenum alloy and titanium alloy.

8. The method of claim 1, wherein the thickness of the first adhesion enhancement layer is 100~1000 Å, and the thickness of the first copper-bearing metal layer is 1500~5000 Å.

9. The method of claim 2, further comprising steps:
(2) sequentially forming a gate insulation material layer and a semiconductor material layer on the substrate subjected to step (1), and processing the semiconductor material layer by a patterning process to form a pattern comprising an active layer, wherein the gate insulation material layer is used for forming a gate insulation layer; and
(3) sequentially forming a second adhesion enhancement layer, a second copper-bearing metal layer and a photoresist layer on the substrate subjected to step (2), and respectively forming a reserved region and a removal region by performing exposure and development on the photoresist layer using a mask plate, wherein the reserved region corresponds to a pattern forming region; simultaneously processing the second adhesion enhancement layer, the second copper-bearing metal layer and the photoresist layer in the removal region by a single wet etching process, to form a second adhesion enhancement intermediate layer corresponding to the second adhesion enhancement layer, a second copper-bearing metal intermediate layer corresponding to the second copper-bearing metal layer, and the photoresist layer on the second copper-bearing metal intermediate layer in the reserved region; and simultaneously processing the second adhesion enhancement intermediate layer, the second copper-bearing metal intermediate layer and the photoresist layer thereon by a dry etching process, then stripping off the photoresist layer, to form a patterned second adhesion enhancement layer and a patterned second copper-bearing metal layer respectively, wherein the second adhesion enhancement layer is a metal layer for enhancing adhesion of the second copper-bearing metal layer to the active layer.

10. The method of claim 9, wherein the patterned second copper-bearing metal layer is a pattern comprising source electrodes and drain electrodes.

11. The method of claim 10, wherein the pattern comprising source electrodes and drain electrodes comprises source electrodes, drain electrodes and data lines formed in the same layer.

12. The method of claim 9, wherein the material of the second copper-bearing metal layer is copper or copper alloy.

13. The method of claim 9, wherein the material of the second adhesion enhancement layer is any one of tungsten, tantalum, titanium, molybdenum, molybdenum alloy and titanium alloy.

14. The method of claim 9, wherein the thickness of the second adhesion enhancement layer is 100~1000 Å, and the thickness of the second copper-bearing metal layer is 1500~5000 Å.

15. The method of claim 9, wherein after the single wet etching process, the width of the formed second adhesion enhancement intermediate layer is larger than the width of the formed second copper-bearing metal intermediate layer, so that the second adhesion enhancement intermediate layer forms a step structure with respect to the second copper-bearing metal intermediate layer, and the step structure will be removed by a subsequent dry etching process.

16. The method of claim 9, wherein the gate insulation material layer is a mono-layer, double-layer or multi-layer structure composed of oxide, nitride or nitrogen oxide.

17. The method of claim 9, further comprising steps:
(4) forming a passivation layer on the substrate subjected to step (3), and forming a passivation layer pattern comprising via-holes by a patterning process; and
(5) forming a transparent conductive layer on the substrate subjected to step (4), and forming a pattern comprising pixel electrodes by a patterning process, wherein the pixel electrodes are connected with the drain electrodes through the via-holes.

* * * * *